United States Patent [19]

Mansfield

[11] Patent Number: 5,143,688
[45] Date of Patent: Sep. 1, 1992

[54] SURFACE ELECTRICAL COIL STRUCTURES

[75] Inventor: Peter Mansfield, Nottingham, England

[73] Assignee: National Research Development Corporation, London, England

[21] Appl. No.: 726,161

[22] Filed: Jul. 2, 1991

Related U.S. Application Data

[63] Continuation of Ser. No. 365,563, Jun. 14, 1989, abandoned.

[30] Foreign Application Priority Data

Jun. 15, 1988 [GB] United Kingdom ............ 8814187

[51] Int. Cl.$^5$ ............................................. G01R 33/20
[52] U.S. Cl. ............................................. 324/318
[58] Field of Search ............... 324/300, 307, 309, 318, 324/322; 128/653 SC

[56] References Cited

U.S. PATENT DOCUMENTS

| | | | |
|---|---|---|---|
| 4,592,363 | 6/1986 | Krause | 324/322 |
| 4,620,155 | 10/1986 | Edelstein | 324/318 |
| 4,636,730 | 1/1987 | Bottomley | 324/322 |
| 4,682,112 | 7/1987 | Beer | 324/322 |
| 4,712,068 | 12/1987 | Savelainen | 324/318 |
| 4,757,290 | 7/1988 | Keren | 333/219 |
| 4,780,677 | 10/1988 | Nissenson et al. | 324/322 |
| 4,783,641 | 11/1988 | Hayes et al. | 333/219 |
| 4,793,356 | 12/1988 | Misic et al. | 324/322 |
| 4,799,016 | 1/1989 | Rezvani | 324/318 |
| 4,812,761 | 3/1989 | Vaughan | 324/318 |
| 4,825,162 | 4/1989 | Roemer et al. | 324/318 |
| 4,839,595 | 6/1989 | Boskamp | 324/318 |
| 4,857,850 | 8/1989 | Mametsa | 324/318 |
| 4,859,947 | 8/1989 | Boskamp | 324/318 |
| 4,924,868 | 5/1990 | Krause et al. | 128/653.5 |
| 4,943,775 | 7/1990 | Boskamp et al. | 324/322 |

FOREIGN PATENT DOCUMENTS

| | | |
|---|---|---|
| 0171741 | 2/1986 | European Pat. Off. . |
| 0222982 | 5/1987 | European Pat. Off. . |
| 0256520 | 2/1988 | European Pat. Off. . |
| 0273484 | 7/1988 | European Pat. Off. . |
| 0274773 | 7/1988 | European Pat. Off. . |
| 0280908 | 9/1988 | European Pat. Off. . |
| 0290315 | 11/1988 | European Pat. Off. . |
| 87/01199 | 2/1987 | PCT Int'l Appl. . |
| 89/05115 | 6/1989 | PCT Int'l Appl. . |
| 2137757 | 10/1984 | United Kingdom . |
| 2149124 | 6/1986 | United Kingdom . |

OTHER PUBLICATIONS

P. Mansfield, "The petal resonator: a new approach to surface coil design for NMR imaging and spectroscopy", Journal of Physics D/Applied Physics, vol. 21, No. 1, Nov. 1988, pp. 1643–1644.

*Primary Examiner*—Michael J. Tokar
*Attorney, Agent, or Firm*—Cushman, Darby & Cushman

[57] ABSTRACT

A surface electrical coil structure for use as a signal receiver and/or transmitter with the desired magnetic field characteristics and which comprises a plurality of small coils positioned over or around a specified volume each coil being singly or severally electrically connected such that the flow of electrical current within each coil produces the desired signal response or magnetic field.

15 Claims, 11 Drawing Sheets

SURFACE ELECTRICAL COIL STRUCTURES

This is a continuation of application Ser. No. 07/365,563, filed on Jun. 14, 1989, which was abandoned upon the filing hereof.

The present invention relates to surface electrical coil structures and coil structures for producing magnetic fields for NMR imaging and spectroscopy. In particular the invention relates to surface coils for use in NMR imaging.

The idea of using surface coils in medical NMR imaging is intuitively attractive because as is well known the closer the coil is to the object being imaged the more signal is expected. This is certainly the case when looking at non-conductive materials. However, biological tissues are conductive and therefore as the coil approaches the body surface, additional coil loading is produced. D. I. Hoult and R. E. Richards, J. Mag. Res. 24, 71-85 (1976), D. I. Hoult and P. C. Lauterbur, J. Mag. Res. 34, 425-433 (1979) examined the problem of inductive pick-up from a coil surrounding a conductive sample. In surface coil design, however, the coil does not normally surround the sample but lies in close proximity to the object being examined. A great deal of work has been published on surface coils W. Froncosz, A. Jesmanowicz, J. B. Kneeland and J. S. Hyde, Mag. Res. Med. 3, 519-603 (1986), W. A. Edelstein, G. S. Glover, C. J. Hardy and R. W. Redington, Mag, Res. Med. 3, 604-619 (1986), J. S. Hyde, A. Jesmanowicz and J. B. Kneeland, Proc. SMRM, New York, 1, 95 (1987), J. F. Schenck, M. H. Ussain and H. R. Hart, Proc. SMRM, New York, 1, 94 (1987), T. M. Grist, A. Jesmanowicz, J. B. Kneeland, W. Froncisz and J. S. Hyde, Mag. Res. Med. 6, 253-264 (1988), in an attempt to optimise surface coil design.

Particular arrangements include a range of purpose-built designs for legs, arms, heads and switched arrays S. M. Wright, R. L. Magin and J. R. Kelton, Proc. SMRM, New York, 1, 96 (1987) for looking at the spine. Much of this effort comes into the category of "cut and try" with very little theoretical basis and, therefore, no clear guiding principle.

It is an object of the present invention to examine the fundamentals of a single loop surface coil and the dissipation mechanism when placed in close proximity with a conductive sample. The method of designing the coil or coils is used to design coil arrays which when used for signal reception and/or as transmitters, have a superior far field performance over a single large loop.

The present invention therefore provides a surface electrical coil structure for use as a signal receiver and/or transmitter with the desired magnetic field characteristics and which comprise a plurality of small coils positioned over or around a specified volume from which signal is received and being electrically connected such that the flow of electrical current within each coil produces the desired field or signal response.

Embodiments of the present invention will now be described, by way of example with reference to the accompanying drawings in which.

Figure 6A:
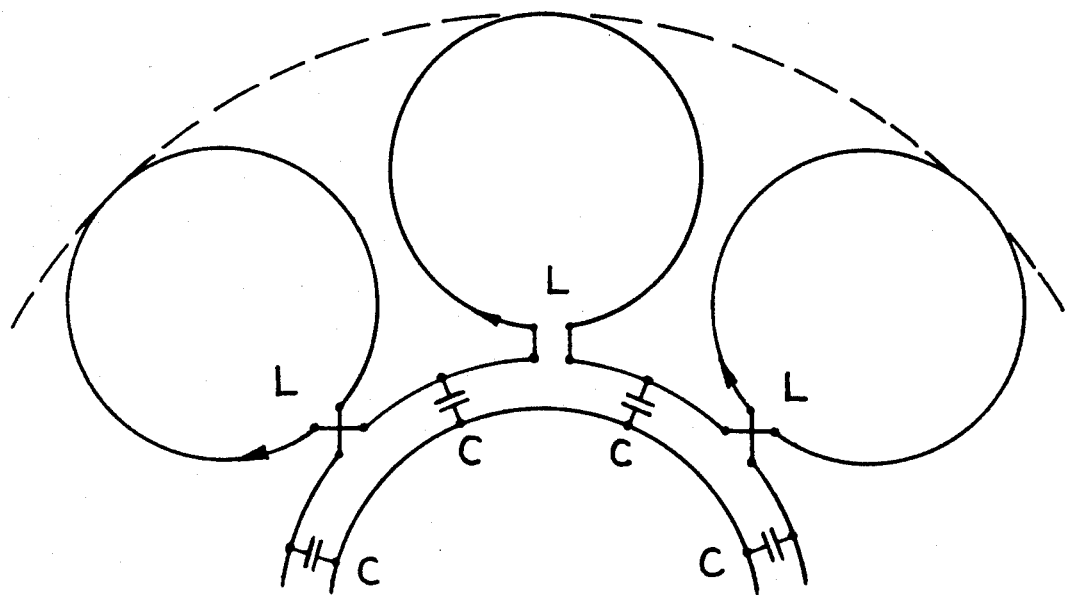
Figure 6B:
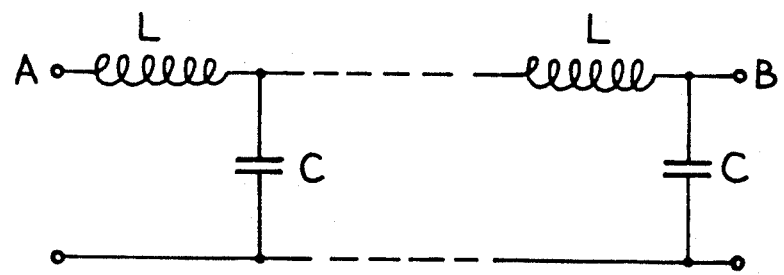
Figure 7:
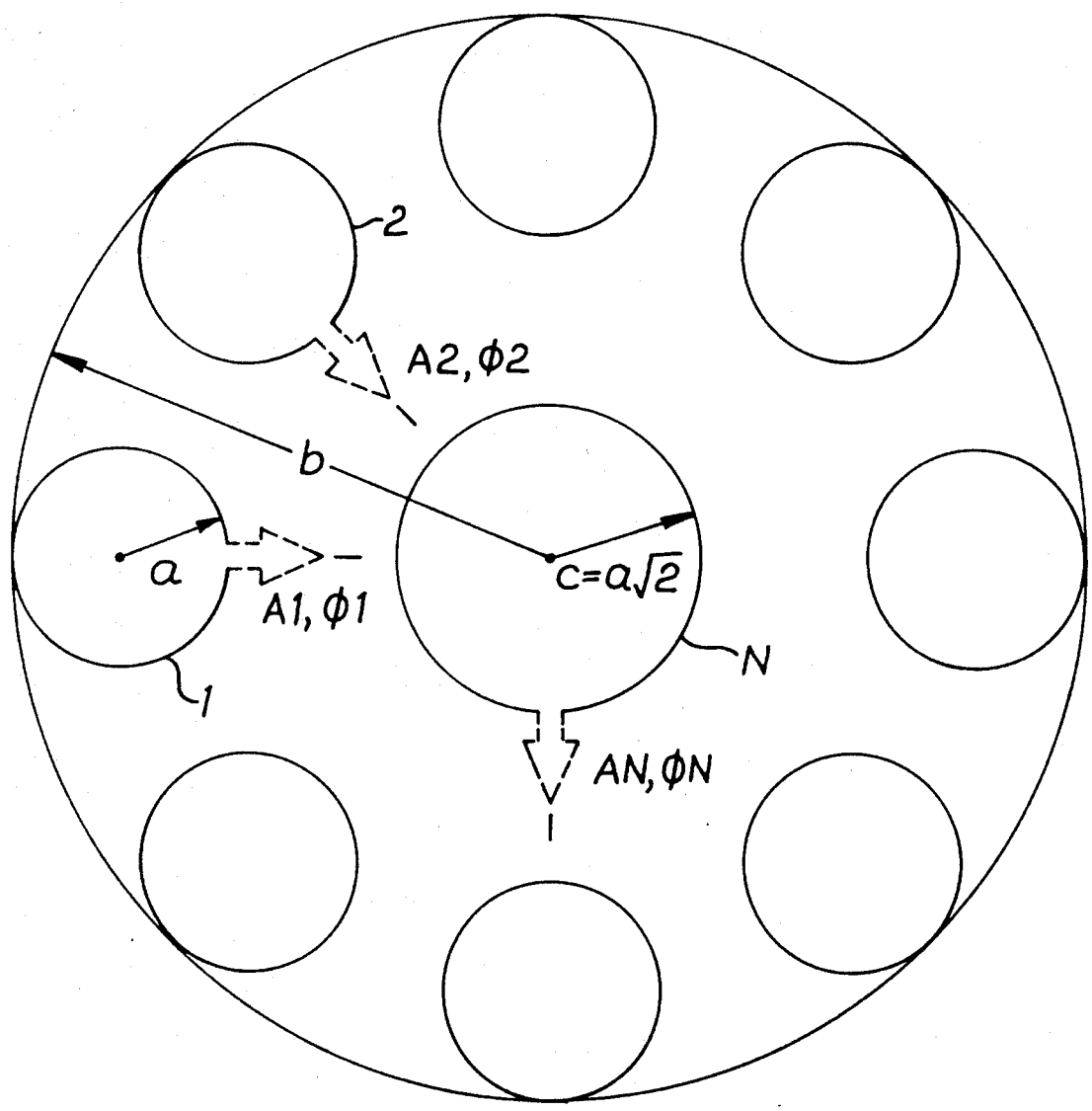

FIGS. 6a and 6b show diagramatically part of a low pass petal resonator showing 6(a) series petal coils and capacitor connections and 6(b) equivalent low pass circuit;

FIG. 7 shows diagramatically a double mode petal resonator identifying the dimensions of the petals of radius a, the centre coil radius o and the equivalent single turn coil radius b. As sketched, b/a=5 and c=a and, in a modification illustrates the concept of individual receiver amplifiers.

Figure 8A:
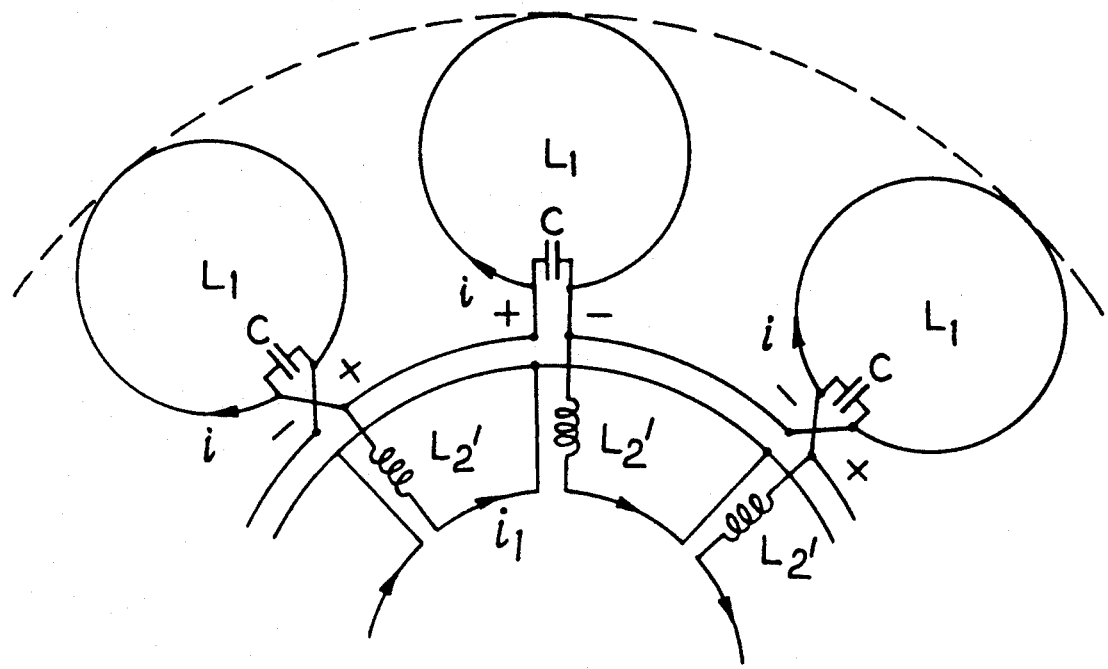
Figure 8B:
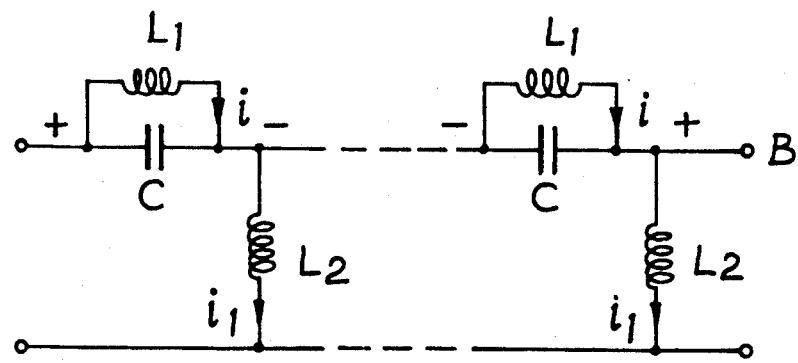
Figure 9:
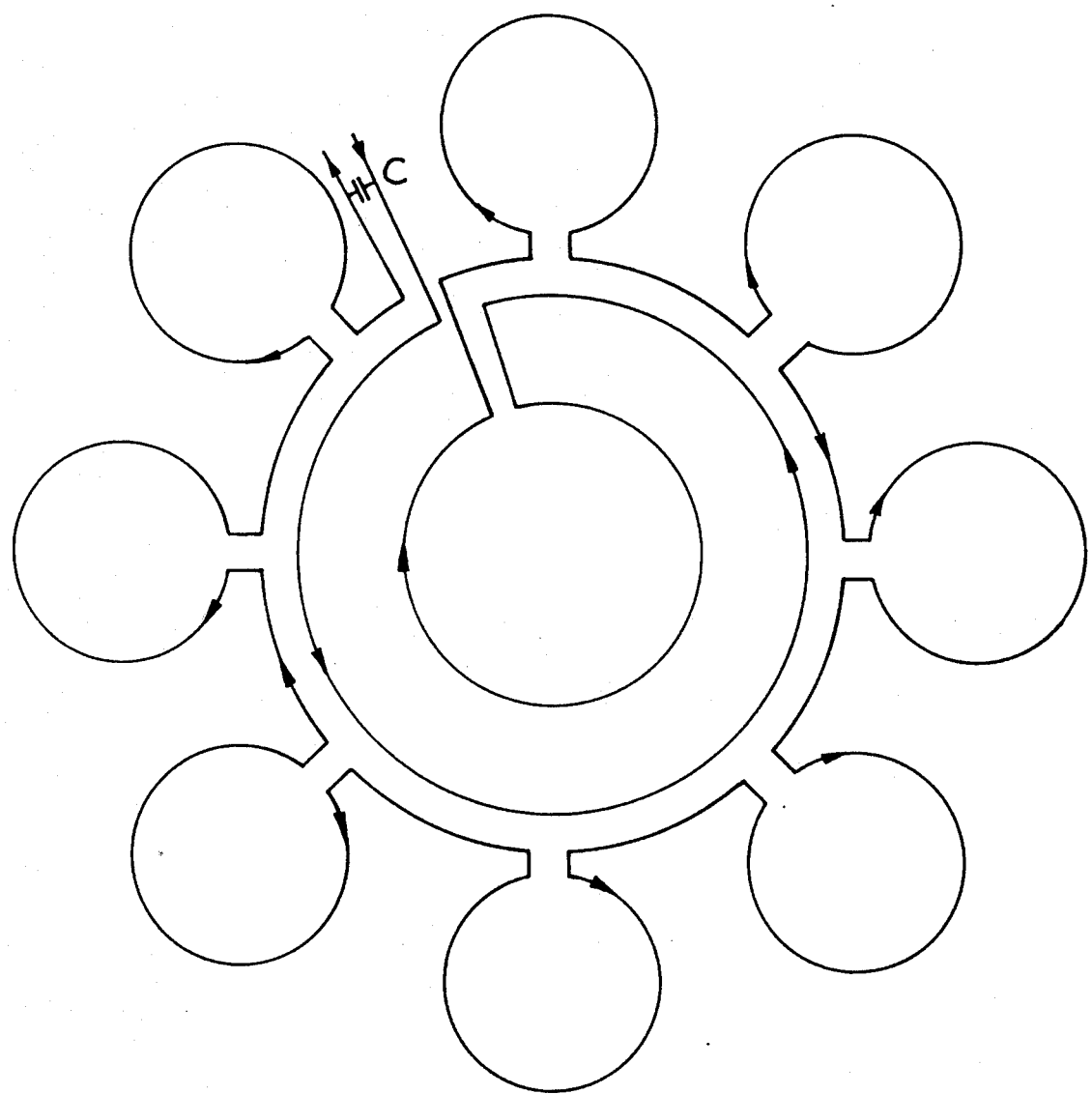
Figure 10:
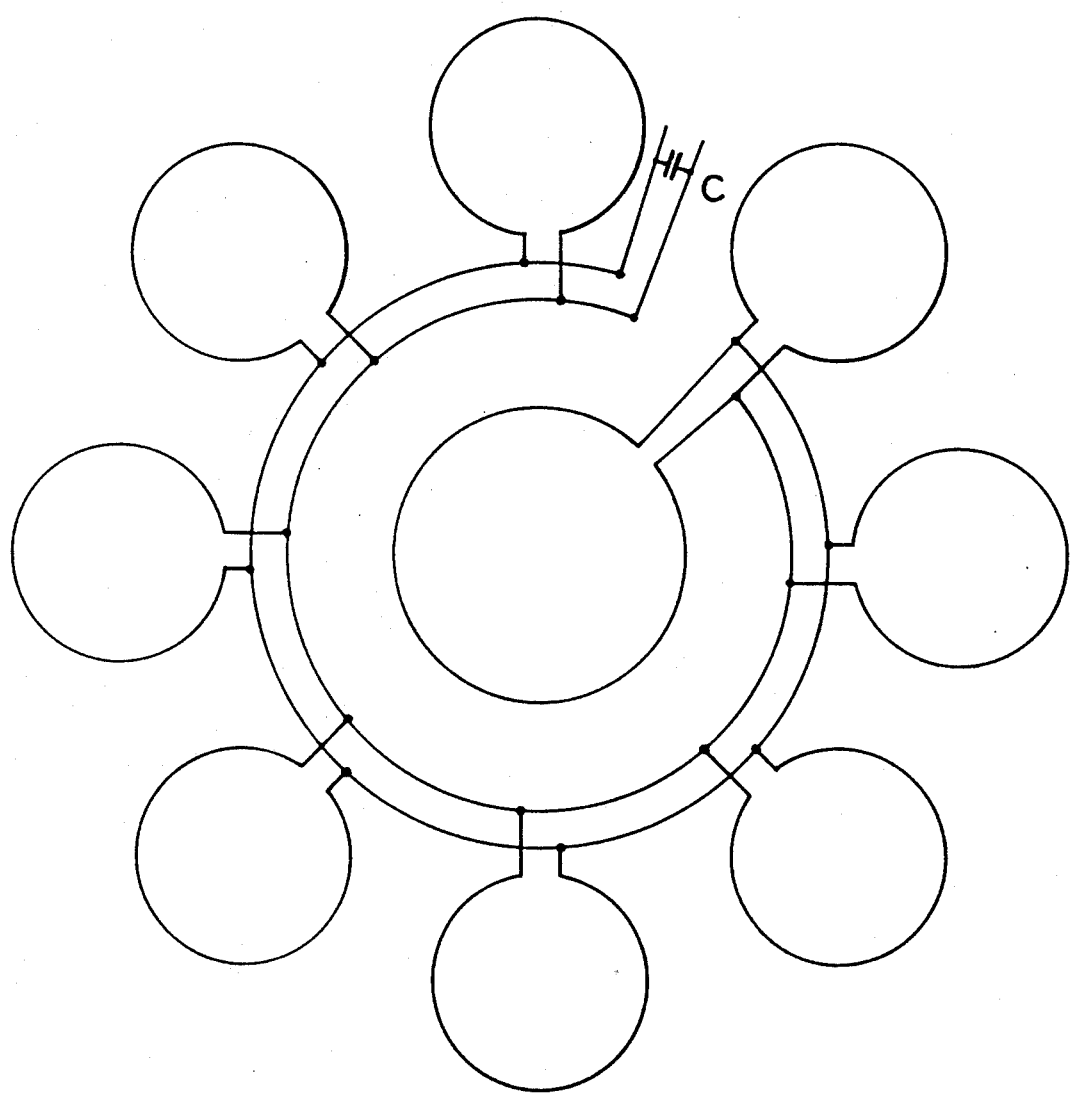
Figure 11:
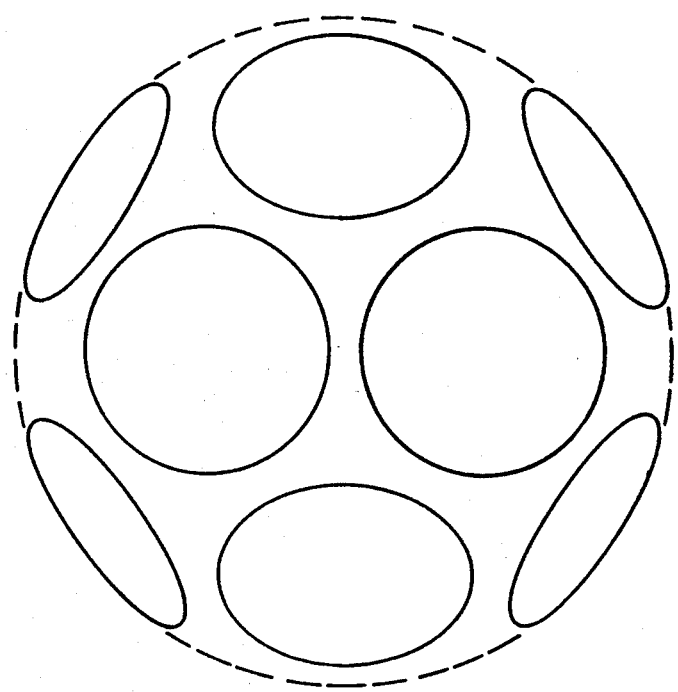
Figure 12:
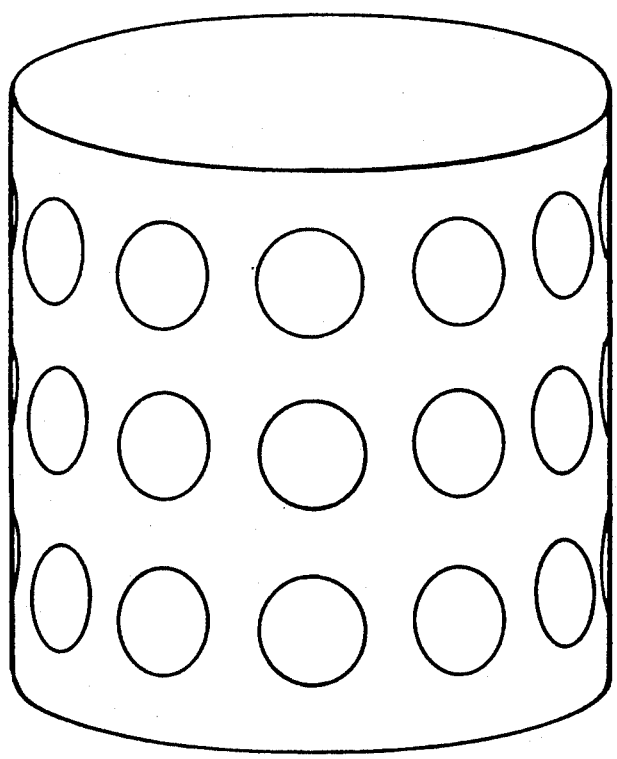
Figure 13:
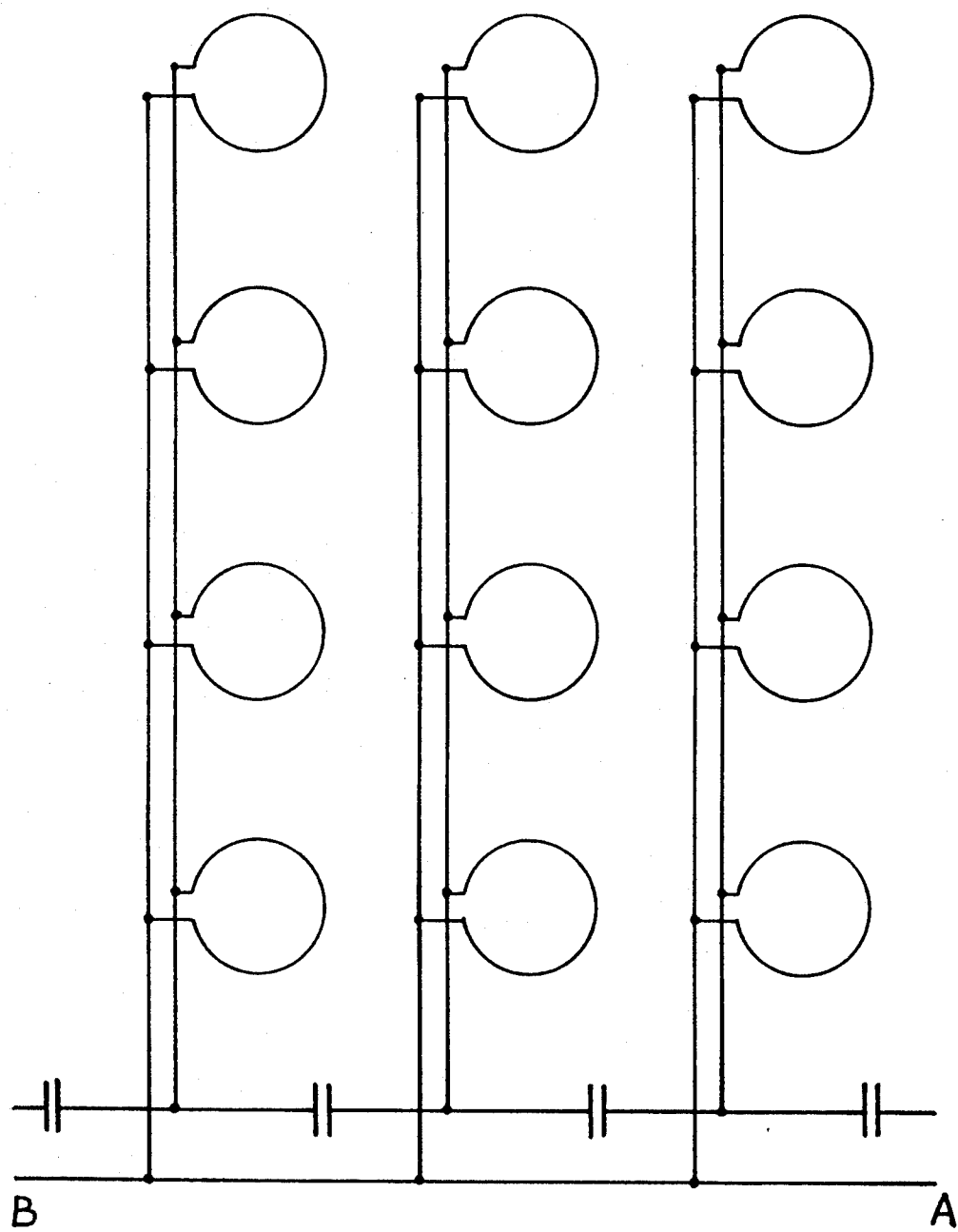

FIGS. 8a and 8b show diagramatically part of a high pass double mode petal resonator showing 8(a) series petal coils with inductance $L_1$, shunt capacitor C and parallel inductance $L_2$, and 8(b) equivalent high pass circuit;

FIG. 9 shows a petal coil as in FIG. 7 in which all elements are wired in series with a single tuning capacitor C. The signal sensitivity factor for this array is $F = \sqrt{(10/5)}$. In this case all coils are passively connected;

FIG. 10 shows a petal coil as in FIG. 7 in which all elements are wired in parallel. The central hoop current is approximately one half that of a single petal. This gives a sensitivity factory of $F = \sqrt{(9/5)}$;

FIG. 11 shows a generalized surface coil array arranged on a spherical surface;

FIG. 12 shows bands or belts of surface coils arranged on the surface of a cylinder to form a chain mail coil. As sketched, all surface coils are the same and spaced by 3 radii between centres, both around and along the cylinder;

FIG. 13 shows a high pass wiring scheme for a chain mail coil; and

Figure 14:
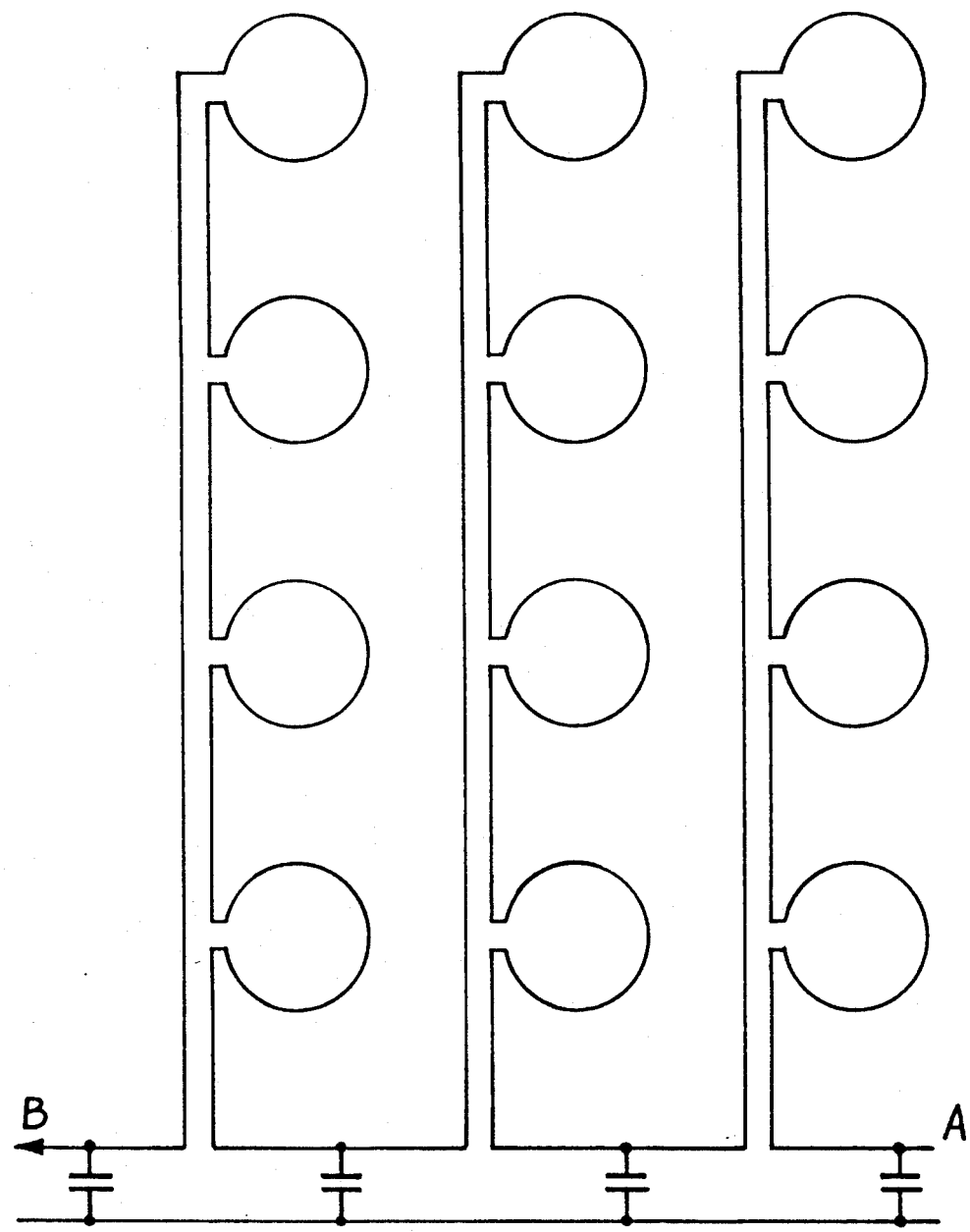

FIG. 14 shows a low pass wiring scheme for a chain mail coil.

THEORY OF SINGLE LOOPS

Figure 1:
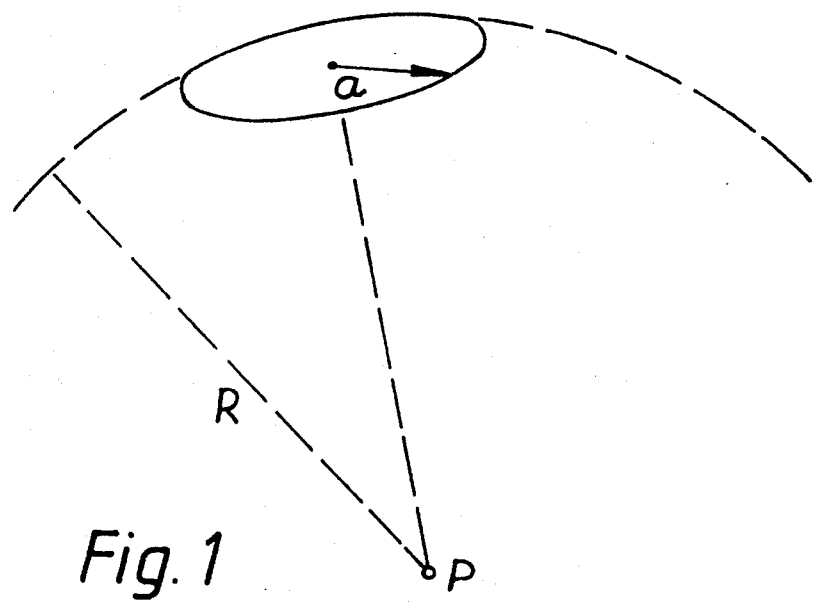
FIG. 1 shows diagramatically a surface coil of radius a subtending point P at distance R.
Figure 2:
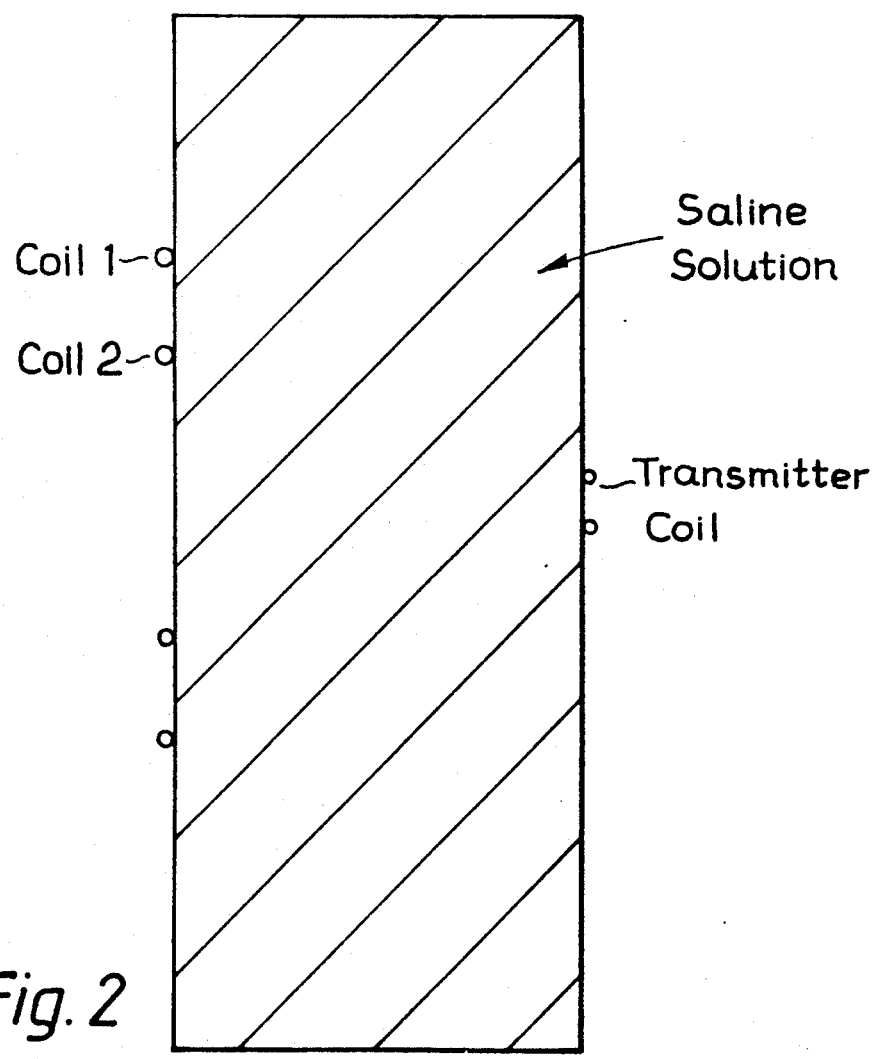
FIG. 2 shows a saline test cell showing disposition of dipole transmitter coil and receiver coils used for the measurements of Table 1.

Consider a tuned coil of radius a with N turns and inductance L which lies on the surface of a sphere of radius R, and receives signals from a point P, FIG. 1. We assume that point P lies within a homogeneous conducting medium of resistivity $\rho$. The signal-noise ratio, (S/N), expected over an integrated volume of material is given (1) by $$S/N = \omega \int \underline{B_1 M} dv / (4kT\Delta fr)^{\frac{1}{2}} \qquad [1]$$

this may be approximated to $$S/N \approx \omega B_1 M \cos \theta V_s / (4kT\Delta fr)^{\frac{1}{2}} \qquad [1a]$$

for a small volume of material $V_s$ and when $B_1$ does not vary significantly over this volume. In these expressions, $\omega$ is the Larmor angle frequency, M is the nuclear magnetisation per unit volume of the specimen, k is Boltzmann's constant, T is the absolute temperature (here assumed to be the specimen temperature), $\Delta f$ is the receiver band width and r is the specimen equivalent resistance producing coil loading. $B_1$ is the magnetic field per turn produced at point P with unit current in the coil and is given by $$B_1 = \mu_0 a^2/2R^3 \quad [2]$$

The polar angle $\theta$ defines the direction of the field vector $B_1$ relative to the sample polarisation vector $\underline{M}$. For constant temperature, bandwidth and fixed frequency, Eq. [1a] reduces to $$S/N = KNB_1/r^{\frac{1}{2}} = KQNB_1/R^{\frac{1}{2}} \quad [3]$$

where Q is the quality factor of the coil and R is the equivalent shunt resistance. The single loop inductance $L_o$ is related to L by the expression $$L = N^2 L_o \quad [4]$$

and $$Q = \tfrac{1}{2} L I^2 \omega / \tfrac{1}{2} \int \rho j^2 dv = \omega L/r \quad [5]$$

where I is the current passing through the coil and $J = Nj$ is the induced current density in a volume element dv of the conductive medium. This reduces to $$Q = \omega L_o/r_o \quad [6]$$

where $$r_o = (\rho/I^2) \int j^2 dv = (\sigma/I^2) \int E^2 dv \quad [7]$$

in which $\sigma$ is the conductivity and E the induced electric field. The resistance $r_o$ is related to r by $$r = N^2 r_o \quad [8]$$

Equations [3–5] together with [8] explain why adding extra turns does not increase the coil performance. We have assumed that the coil damping derives entirely from coupling with the specimen. The integration of current density is performed over 2 radians (i.e. half space). The volume integral, Eq [7], may be rearranged in terms of a dimensionless variable $\xi = 1/a$ (where $\mu l^2 = x^2 + y^2 + z^2$) in which case it follows that $$r \propto a^3 . \text{tm} \quad [9]$$

The constant of proportionality is a dimensionless integral which depends on the shape of the coil and is therefore the same for all flat circular coils. But the single loop inductance $L_o$ is given by (4)

$$L_o = \mu_0 a [\log(8a/d) - 2] \quad [10]$$

where $\mu_o$ is the permeability of free space and d is the wire diameter. For a/d constant, Eq[10] makes $L_o$ directly proportional to coil radius, i.e., $$L_o \propto a. \quad [10a]$$

From Eqs. [5, 9 and 10] we find $$Q = \omega k/a^2, \quad [11]$$

where k is a constant.

Using Eqs. [2 and 11], the signal S picked up in the coil is $$S = B_1 Q = \kappa \quad [12]$$

where $\kappa$ is a constant independent of coil radius. This result means that a signal source at point P will induce the same voltage in any coil on the surface of the sphere. Of course this result does not include the noise calculation. When this is included Eq. [3] together with Eqs. [2 and 9] gives $$S/N \propto a^{\frac{1}{2}}. \quad [13]$$

EXPERIMENTAL RESULTS

As an experimental check on the results and the assumption on which they are based, some simple experiments were performed with two single loop coils of radius 7 cm and 4.25 cm. The loops were made of 14 SWG copper wire. The measurements were made with the coils fixed to the surface of a cell containing saline solution. The induced signal measurements were made by coupling a small 10 turn coil of radius 7 mm approximating to a dipole radiator, through the cell to one or other of the single loop coils as indicated in FIG. (2). Each coil was turned to 20 MHz and the voltage developed across them in response to the dipole field was measured. The cell thickness was 6.8 cm including two 3 mm thick glass plates. The dipole radiator coil was driven with a constant RF signal of 2.0 v at 20 MHz. Results were obtained with the cell empty and with a 2M saline solution. The measured signals are shown in Table 1.

TABLE 1

| Solution | Voltage ratio $V_1/V_2$ | | $V_1$ | $V_2 \times$ 5 mV |
|---|---|---|---|---|
| | Exptl. | Theor. | | |
| 0 | 3.0 | 2.713 | 3.6 | 1.2 |
| 2M | 1.25 | 1.0 | 2.0 | 1.6 |

M = 25 gm/l

Within experimental error, the results of Table 1 and other experimental work (6), seem to confirm the general correctness of Eq. [12].

Using a Q meter, independent parameters for each coil were measured as indicated in Table 2.

TABLE 2

| NaCl concentn. c | Coil 1 (a = 10 cm) | | | | Coil 2 (a = 4.25 cm) | | | |
|---|---|---|---|---|---|---|---|---|
| | $Q_1$ | $C_1$(pf) | $L_1(\mu H)$ | $r_1(\Omega)$ | $Q_2$ | $C_2$(pf) | $L_2(\mu H)$ | $r_2(\Omega)$ |
| empty | 130 | 190 | 0.33 | .319 | 85 | 260 | 0.24 | .355 |
| 0 | 130 | 208 | | | 80 | 250 | | |
| | (120) | (215) | | | (85) | (250) | | |
| 1M | 72 | 215 | | | 83 | 245 | | |
| 2M | 55 | 205 | | | 80 | 240 | | |
| | (55) | (212) | | | (76) | (247) | | |
| 3M | 44 | 208 | | .943 | 67 | 250 | | .428 |
| | | | | | (70) | | | |

TABLE 2-continued

| NaCl concentn. | Coil 1 (a = 10 cm) | | | | Coil 2 (a = 4.25 cm) | | | |
|---|---|---|---|---|---|---|---|---|
| c | $Q_1$ | $C_1$(pf) | $L_1$(μH) | $r_1(\Omega)$ | $Q_2$ | $C_2$(pf) | $L_2$(μH) | $r_2(\Omega)$ |
| 4M | 42 | 209 | | | 65 | 247 | | |

M = 25 gm/l.

The empty cell results show that neither the wire resistance nor coil inductance appear to have the expected linear dependence on coil radius, since this predicts the same Q for both coils. Some of the discrepancy could be due to the finite wire length and connections used to couple the coils to the Q meter. Nevertheless, the results do confirm the greatly increased coil loading of the larger coil as the saline concentration c is increased. The drop off in Q versus c is faster for coil 1 and reflects the smaller contribution of the wire resistance to $r_1$ relative to $r_2$.

SURFACE COIL ARRAYS

Figure 3:
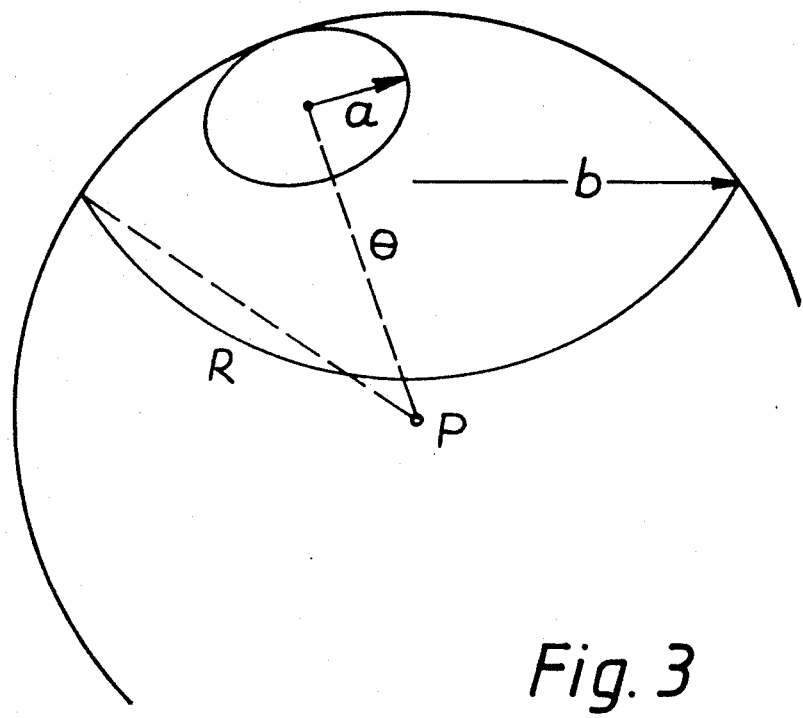
FIG. 3 shows diagramatically a large coil radius b on the surface of a sphere radius R and disposition of a small surface coil radius a on the spherical cap with centre displaced by the polar angle $\theta$.

The localised nature of surface coils means that several small coils may be clustered on the spherical surface, FIG. 3, subtending the point P. Provided that the coils do not couple too strongly, we may regard the signal pick-up in each coil as independent of the other. From Ampere's circuital theorem, the field at P from a single loop of radius b carrying a current I is equivalent to a number N of smaller coils of radius a, each carrying current I, and spread on the spherical cap. For R>b, the maximum value of N is given by $$N_{max}=(b/a)^2 \quad [14]$$

but in this case, the coils would all be touching and therefore strongly interacting, for from Eq. [10]

$$L=kb<N_{max}ka. \quad [15]$$

Since in the limit of touching coils the single turn inductance $L_1=N_{max}L_2$, $L_2$ is reduced exactly by the mutual inductance to all other coils. In this case, sample losses are the same whether we have one large coil or many small coils. However, for spaced coils, where the mutual inductance is kept small, the independence is preserved. To minimise interactions, therefore, we require a number of coils $$N = \alpha^2 N_{max} \quad [16]$$

where $\alpha <1$.

An important question is whether a set N of weakly interacting coils of radius a can together produce a better S/N than a single coil of radius b. We emphasise again that we are specifically interested in the far field response. It is clear that the near field response of smaller coils is always better than for large coils, but the field of view is restricted. The object here is to maintain the field of view, particularly for deep tissue.

From Eq. [13] the signal-noise ratio $(S/N)_a$ for the coil of radius a relative to that of coil radius b $(S/N)_b$ is given by $$(S/N)_a=(S/N)_b[a/b]^{\frac{1}{2}}\cos\theta \quad [17]$$

where $\theta$ is the polar angle, FIG. 3. For N small coils of equal radius a the signal-noise ratio is $$(S/N) = (S/N)_b\cos\theta\,[Na/b]^{\frac{1}{2}} \quad [18]$$
$$= (S/N)_b\alpha[b/a]^{\frac{1}{2}}\cos\theta.$$

We therefore look for conditions which make the sensitivity factor $$F=[Na/b]^{\frac{1}{2}}\cos\theta=\alpha[b/a]^{\frac{1}{2}}\cos\theta>1. \quad [19]$$

If R is large we may take cos o 1. In this case for a/b=4 and N=8, F=1.414. This particular combination gives $\alpha^2=0.5$ and means that the array occupies only half the area of the large coil. Interestingly, however, Eq. [19] predicts for small values of $\alpha^2$, corresponding to lower fractional areas of the array, that F may still be made greater than unity by increasing b/a, i.e. by using very small coils in the array.

This assumes no correlation of the noise resistance area between coils. That is to say, the total noise resistance is just N times that of a single small coil. If there is correlation the sensitivity factor F will be reduced.

PETAL RESONATOR

Figure 5:
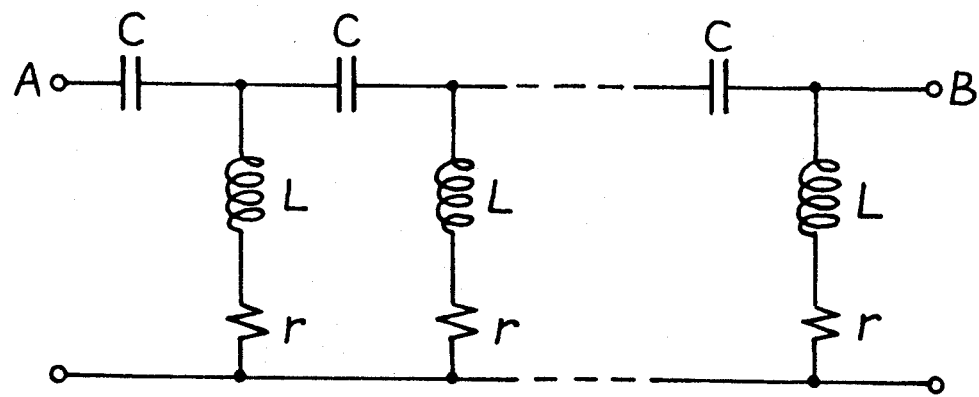
FIG. 5 shows an equivalent circuit of the petal resonator shown in FIG. 4 L is the effective inductance of each petal, r its effecitive resistance and C the inter-coil connective capcitance.
Figure 4:
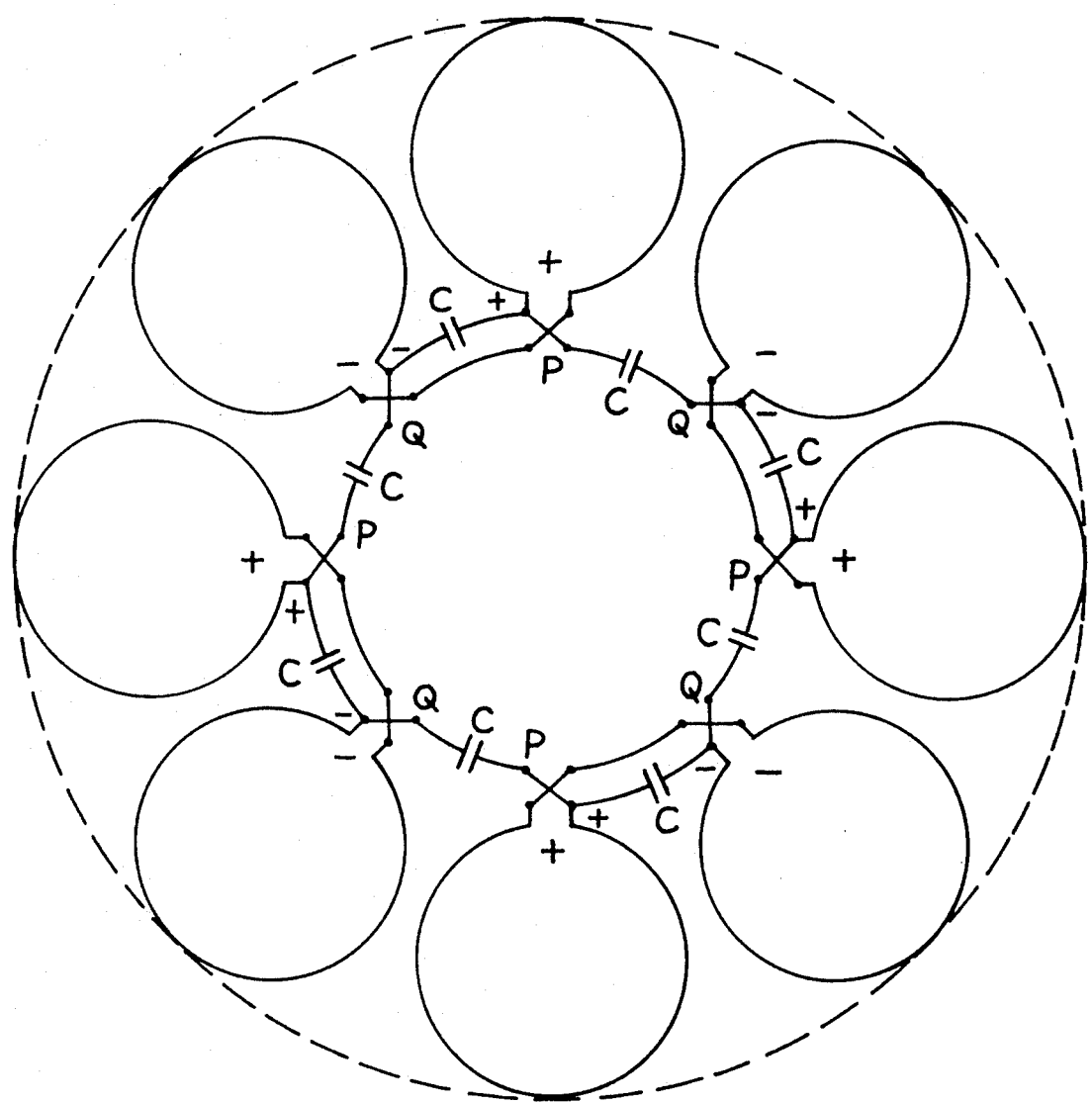
FIG. 4 shows diagramatically an 8 section high pass petal resonator showing coil connections. The ratio b/a=4 for this diagram.

The foregoing principles are used to design the surface coil array shown in FIG. 4 comprising 8 coils of radius 3 cm representing a single coil of radius 12 cm. According to Eq. [19] an improvement in signal-noise ratio of 1.414 would be expected for non-interacting coils. With the particular arrangement sketched, interaction between coils is not negligible but could be reduced by using flux funnels. The equivalent circuit of the coil array is the high pass circuit shown in FIG. 5 in which the inductance L is given by $$L=L_o-\epsilon M$$

where $L_o$ is the isolated single petal inductance, M is the mutual inductance of a near neighbour coil and $\epsilon>1$ is a factor which takes account of all mutual inductance effects. For the circuit to act as a resonator, A and B are connected. Furthermore all fields must be in phase. This condition is met by satisfying the expression $$\omega^2=\omega_o^2/[4\sin^2(\beta/2)] \quad [21]$$

in which $$\omega_o^2=1/LC, \quad [22]$$

$\omega<\omega_o$ is the RF operating frequency and $\beta$ is the phase shift per section. In our case we require $\beta=180°$ which gives $\omega_o=2\omega$. Since the current phase is alternately positive and negative around the petals, it is also necessary to alternate polarity of the connections to the coils to keep all fields in phase.

The resonator coils are capable of sustaining other modes of transmission. In general for N sections in the resonator connected in a closed loop a transmission mode M will be sustained if the total phase around the circuit equals $2\pi M$. This is guaranteed if $$N\beta = 2\pi M \quad [22a]$$

where $1 \leq M \leq N/2$.

The resonator Q value is given by $$Q = \omega \Sigma I_n I_n^2 / \Sigma_n I_n^2 \quad [23]$$

For $L_n = L$, $I_n = I$ and $r_n = r$, Eq. [23] gives the familiar result, $Q = \omega L/r$.

The lowest transmission mode $M = 1$ is the one which gives the 180° phase shift across each section. In this mode, points P (FIG. 4) have a positive equipotential and points Q a negative equipotential. In this case, points P may be strapped together since no current flows. The same may be done with points Q. This then forces the resonator into a single mode and forbids modes with larger M values.

An alternative low pass circuit arrangement in which the petal inductors are in series is shown in part in FIG. 6a. To make this circuit resonate A is connected to B. The condition which makes all fields in phase is $$\omega^2 = \omega_o^2 4 \sin^2(\beta/2) \quad [24]$$

with $\beta = 180°$ and where $\omega_o$ is defined in Eq. [22]. A similar strapping arrangement of equipotential points will force single mode with $M = 1$.

In both coil arrangements we require an even number of sections.

DOUBLE MODE PETAL RESONATOR

While the petal resonators in FIGS. 4 and 6 should produce a better far field response than the equivalent single loop, it will be seen that since most of the central coil is missing in both arrangements, the near field response will be poorer than that of the single loop. This may be rectified by placing a small single loop at the centre of the petal resonator as indicated in FIG. 7. The petal coil wiring details and the equivalent circuit for this high pass arrangement are shown in FIG. 8 where $L_1$ and C are the petal coil inductance and shunt capacitors and $L_2$ is the combined inductance of the centre hoop section and added inductance $L_2'$ indicated in the diagram. For this circuit we must satisfy the relationship $$\omega^2 = \omega_1^2 + \omega_2^2/4 \sin^2(\beta/2) \quad [25]$$

in which $\omega > \omega_1$ and where $$\omega_1^2 = 1/L_1 C, \quad [26]$$

and $$\omega_2^2 = 1/L_2 C \quad [27]$$

and where again $\beta$ is the phase shift per section. To ensure correct phasing of the second mode centre coil section, we choose $\omega_1 = \omega/\sqrt{2}$ and $\omega_2 = \omega/2$ which means that $L_1 = 4L_2$. This makes $i_1 = 2i$ which increases the centre section sensitivity by a factor of 2. For $b = 5a$ and $c = a\sqrt{2}$, the petal coil has an increased sensitivity of $F = 1.653$.

PETAL COILS

Much of the above discussion has been concerned with designing resonant arrays which operate at high frequencies where inter-turn coil capacitance is important. However, at low frequencies it is possible to tune petal coil arrays directly. For example FIG. 9 shows a 9 coil petal array in which all coils are placed in series with a single tuning capacitor C. The dimensions of these coils are the same as in FIG. 7. However, since the current is the same through all coils the sensitivity factor $F = \sqrt{(10/5)}$.

An alternative parallel wiring arrangement for the same petal array is shown in FIG. 10. The sensitivity factor is slightly different since the centre coil in general will pass a different current to that of the petals.

LOW TEMPERATURE COILS

The analysis so far has ignored the finite resistance of the petal coils. This means that the petal coil performance will be slightly worse than predicted since there will be a noise input from the finite resistance of the coil wire. This effect may be reduced somewhat by using thick wire, but for large arrays of small diameter coils, it will be advantageous to cool the coil array in liquid nitrogen or even liquid helium. In the latter case, there may be some advantage to using superconductive materials for the coil wire.

MUTUAL INDUCTANCE EFFECTS

So far we have completely ignored mutual inductance effects arising from the proximity of the coils. For co-planar circular coils, mutual inductance will reduce the flux from the sample region coupling the coil. This effectively reduces the coil response function $B_1$ and thereby directly affects the signal-noise ratio achievable with a given coil array. The question, therefore, is whether these mutual inductance effects can be simply estimated and whether a given coil array can be optimised taking into account mutual inductance. In this section we develop an approximate theory for mutual inductance based on an average field coupling with a given coil.

From Faraday's law the induced EMF in a coil is given by $$\epsilon = L \frac{di}{dt} = \int \overline{B} \cdot ds \quad [28]$$

where all the symbols have their usual meanings. We replace the flux integral by an average flux over the coil area A and in this case Eq. [28] reduces to $$L = \overline{B}_{av} A / I = B_1 A \quad [29]$$

where $B_1$ is an average field per unit current.

Let us now consider 2 circuits labelled 1 and 2. The mutual inductance M coupling circuit 1 with area $A_1$ to circuit 2 with current $I_2$ and average field per unit current $B_1^2$ is given by $$M = \overline{B}_1^2 A_1 / I_2 \quad [30]$$

The effective inductance of coil 1 is reduced by the mutual inductance and is given by $$L - M = \overline{B}_1^{\,1} A_1 / I_1 - \overline{B}_1^{\,2} A_1 / I_2 \quad [31]$$

If $I_1 = I_2$, the effective inductance Eq. [31] is given by $$L - M = A_1 B_{1\text{eff}} \quad [32]$$
$$= L B_{1\text{eff}}/B_1^1$$

By simple re-arrangement of Eq. [32] we obtain the expression for effective field per unit current $$B_{1\text{eff}} = \overline{B}_1{}^1([L-M]/L) \quad [33]$$

For the given arrangement in the petal resonator of FIG. 7, we let M be the mutual inductance of a small coil to all other coils in the array. This is, therefore, given by $$M = 2M_1 + 2M_2 + 2M_3 + M_4 + 2M_{SL} \quad [34]$$

where $M_1$ is the mutual inductance between one of the first near neighbour small coils, $M_2$ is the mutual inductance between one of the second near neighbour small coils, $M_3$ is the mutual inductance between one of the third near neighbour small coils and $M_4$ is the mutual inductance between the diagonally opposite small coil and $M_{SL}$ is the mutual inductance between the large central coil and any one small coil. Using Eq. [33] the effective field per unit current for a small coil is given by $$B_1{}^S\text{eff} = ([L_S - M/L_S])B_1{}^S \quad [35]$$

A similar expression for the large central coil is given by $$B_1{}^L\text{eff} = ([L_L - 8M_{LS}]/L_L)B_1{}^L. \quad [36]$$

By reciprocity $M_{SL} = M_{LS}$.

It is a straightforward matter to evaluate the magnetic field per unit current in the coil plane. We assume that for coils with centres spaced by three radii that the field variation produced by one coil over the area of a second coil is small and is approximately equal over the whole area to the field at the centre of the coil. In this case all mutual inductances in Eq. [34] may be straightforwardly evaluated for a given coil array. For the arrangement sketched in FIG. (7) and with a=2 cm and c=2.828 cms, we find that $M/L_S = 2.85 \times 10^{-3}$ and $8M_{LS}/L_L = 4.17 \times 10^{-3}$. In the particular case discussed we see that mutual inductance effects are very small and reduce the sensitivity factor F by less than 1%.

The particular arrangement discussed here was not optimised. However, it is clear that such an optimisation procedure may be performed allowing, for example, the coil radii to be increased slightly to optimise F.

In a modification of FIG. 7 shown dotted each of the petal coils 1, 2 ... N are connected singly or severally to individual receivers amplifier A1, A2 ... AN which have RF amplifier gains A1, A2 ... AN and RF phases $\phi 1, \phi 2 \ldots \phi N$. These amplifiers may be separately interrogated or their outputs may be added to form an active array with a single output.

Alternatively the coils 1 ... N may be directly wired together in a passive arrangement without individual amplifiers (for example in the manner shown in FIG. 9), the total signal being fed into a single receiver amplifier (not shown).

The individual coils 1, 2 ... N may be separately tuned.

GENERALISED COIL ARRAYS

Since we have been concerned with the far field response the foregoing principles and analysis may be generalised to the design of arbitrarily shaped RF receiver coils. That is to say, coils which may now completely surround the subject rather than restricting the coil arrangement to a localised surface coils. A typical generalised array is shown in FIG. (11). It has the appearance of mediaeval chain mail armour. The small ringlet coils, although of arbitrary diameter, are best chosen with the smallest diameter practicable. For an RF receiver coil with axial access along the direction of the main magnetic field in an electromagnet or superconductive magnet, the design objective is to produce a uniform RF magnetic field $B_1$ which is transverse to the field axis. That is to say, if the magnetic field points along the z axis, the $B_1$ field should be uniform with its field vector lying in the x-y plane. The optimum surface current distribution on a cylindrical surface forming the RF coil support, is a function which varies with azimuthal angle $\phi$ as sin $2\phi$. The current distribution for given angle $\phi$ is ideally independent of z. Such an arrangement may be built up of small coils forming a set of separate bands or belts, each of which uniformly spans the circumference of the cylindrical surface, FIG. (12). As with the petal resonator, it is necessary that the chain mail links are not too close to each other. The above work suggests that all coils should be spaced at least one radius apart in all directions.

Each band or belt of coils forms a resonant array as previously described. As with the petal resonator, there are a number of electrical configurations which allow the coils to be connected as either a low pass or high pass transmission line. For the high pass circuit of FIG. (13), the condition for a standing wave in the resonant chain or band of coils is given by $$\omega^2 = \omega_0^2/4 \sin^2 [\pi M/2N]. \quad [37]$$

For the alternative low pass arrangement of FIG. (14) the corresponding resonant mode condition is given by $$\omega^2 = \omega_1^2 + \omega_2^2/4 \sin^2 [\pi M/2N] \quad [38]$$

where N is the number of coil sections in the band, M is the propogation mode number which satisfies the inequality $1 \leq M \leq N/2$ and all other terms in Eqs. [37 and 38] have the previous meanings as defined in Eqs. [21, 22, and 25-27]. In a practical embodiment of this principle, it is necessary to stack the bands along the z direction spacing them by at least one small coil radius, and aligning the coils so that they all have the same azimuthal displacements. We refer to this as the cylindrical chain mail coil. However, it will be clear that the chain mail principles may be straightforwardly extended to particular fitted coils for head studies, limbs and other parts of the anatomy where it is possible to completely surround the object being studied with a close-fitting form which may be cylindrical, elliptical, hemispherical, sperical with access at the poles or in general some arbitrary shape. For complicated surfaces, the necessary current drive representing the local surface current distribution may be difficult to achieve in practice. As we have seen, however, for cylindrical coils the requisite current distribution is straightforward to produce. The same situation obtains for flat, parallel Helmholtz-like coils where to a first approximation the coil response is uniform over each flat plane. In this situation two petal resonators with the appropriate spacing could be used to sandwich the object being imaged.

Simple measurements on single turn surface coils have indicated that in the presence of a conducting medium the coil losses can be greatly reduced by using small radius coils. This being the case it is proposed that large and lossy surface coils may be replaced by an array of smaller coils forming a resonator circuit. Provided that the mutual inductance between the small coils and noise correlation effects may be neglected, it is shown that there is small but significant improvement in the coil performance over that of a single large coil.

Various versions of the petal resonator circuit are proposed. In one series version the petal coils could be made of copper strip rather than wire or tubing. Such an arrangement would help to funnel flux through the coil and reduce mutual inductance effects. Each single petal would form a split or slotted coil resonant circuit which at low frequencies would require additional capacitance to tune but at high frequencies could be machined to form a self resonant circuit element.

Although we have concentrated here on essentially flat and hemispherical coil arrays, the principles of resonator arrays may be straightforwardly applied to more complicated array geometries for limbs, joints, the head and spine, etc. Indeed, the principles outlined may be straightforwardly applied to the design of non-surface coils, i.e. cylindrical or other arrays which we refer to as chain mail coils.

I claim:

1. A surface electrical coil structure for use as a signal receiver comprising:
a plurality of coils, each coil comprising at least one electrical conductor positioned adjacent to a volume, each coil being electrically connected to provide a desired signal response from the volume, in which each coil is positioned and sized such that there is a predetermined distance between the electrical conductors of each coil, the coils being in a non-overlapping situation to enable the signal receiver to receive signals from the far field at least equal to those received from an equivalent large coil; and
a delay line configuration connected between said coils, including a plurality of capacitors connected between said coils which uses an inductance and a capacitance of each said capacitor as tuning elements of the delay line configuration.

2. A surface electrical coil structure as claimed in claim 1, in which the signals from the plurality of coils are received in a parallel arrangement into a single amplifier and receiver circuit.

3. A surface electrical coil structure as claimed in claim 1, in which the plurality of coils are connected in series and the total signal is fed into a single amplifier receiver circuit.

4. A surface electrical coil structure as claimed in claim 1, in which the coils are connected to individual amplifiers thereby forming a plurality of receivers which are summed into a single signal.

5. A surface electrical coil structure as claimed in claim 1, in which the coils are connected to individual amplifiers thereby forming a plurality of receivers having output signals, the output signals from the receivers being summed into a single signal.

6. A surface electrical coil structure for use as a signal transmitter comprising:
a plurality of coils, each coil comprising at least one electrical conductor positioned adjacent to a volume, each coil being electrically connected to provide a desired magnetic field within the volume, in which each coil is positioned a predetermined distance from each other coil in the plurality of coils and in which each coil is sized such that there is a predetermined distance between the electrical conductors of each coil, the coils thereby being in a non-overlapping situation to enable the transmitter to generate a far magnetic field which is at least equal to that generated by an equivalent single large coil; and
a delay line configuration connected between said coils, including a plurality of capacitors connected between said coils which uses an inductance and a capacitance of each said capacitor as tuning elements of the delay line configuration.

7. A surface electrical coil structure as claimed in claim 6, in which the magnetic field at any point distant from the array, produced by each small coil comprising the array considered as a finite element, mimics the field at a given point which would be produced by an equivalent continuous current distribution over the surface of an object which is necessary to produce the desired field at the same point within the object.

8. A surface electrical coil structure as claimed in claim 1, further comprising flux funnels from each of said plurality of coils.

9. A surface electrical coil structure as claimed in claim 6, further comprising flux funnels for each of said plurality of coils.

10. A surface electrical coil structure as in claim 1 wherein said plurality of coils include a plurality of spaced coils organized in a petal-like shape, so that outermost tangents of each of said coils form each circle.

11. A surface electrical coil as in claim 10 further comprising an additional single coil in a center of said petal-like shape.

12. A surface electrical coil structure as in claim 6 wherein said plurality of coils include a plurality of spaced coils organized in a petal-like shape, so that outermost tangents of each of said coils form a circle.

13. A surface electrical coil as in claim 12 further comprising an additional single coil in a center of said petal-like shape.

14. A surface electrical coil as in claim 1 wherein said plurality of coils comprise a plurality of small coils spaced from one another in a way to surround the subject.

15. A surface electrical coil as in claim 6 wherein said plurality of coils comprise of plurality of small coils spaced from one another in a way to surround the subject.

* * * * *